United States Patent
Ogino et al.

(10) Patent No.: US 9,837,575 B2
(45) Date of Patent: Dec. 5, 2017

(54) METHOD OF MANUFACTURING SOLAR BATTERY CELL

(71) Applicant: PVG Solutions Inc., Kanagawa (JP)

(72) Inventors: Takayuki Ogino, Kanagawa (JP); Shinobu Gonsui, Kanagawa (JP); Futoshi Kato, Kanagawa (JP); Shogo Tasaka, Kanagawa (JP); Ryota Aono, Kanagawa (JP); Ryosuke Oku, Kanagawa (JP); Yasuyuki Kano, Kanagawa (JP); Shinji Goda, Kanagawa (JP); Naoki Ishikawa, Kanagawa (JP)

(73) Assignee: PANASONIC PRODUCTION ENGINEERING CO., LTD., Osaka (JP)

( * ) Notice: Subject to any disclaimer, the term of this patent is extended or adjusted under 35 U.S.C. 154(b) by 0 days.

(21) Appl. No.: 14/766,302

(22) PCT Filed: Jan. 30, 2014

(86) PCT No.: PCT/JP2014/052104
§ 371 (c)(1),
(2) Date: Aug. 6, 2015

(87) PCT Pub. No.: WO2014/123060
PCT Pub. Date: Aug. 14, 2014

(65) Prior Publication Data
US 2015/0372184 A1    Dec. 24, 2015

(30) Foreign Application Priority Data
Feb. 6, 2013 (JP) ................. 2013-021205

(51) Int. Cl.
H01L 21/00    (2006.01)
H01L 31/18    (2006.01)
(Continued)

(52) U.S. Cl.
CPC ........ *H01L 31/1864* (2013.01); *H01L 21/223* (2013.01); *H01L 31/068* (2013.01);
(Continued)

(58) Field of Classification Search
None
See application file for complete search history.

(56) References Cited

U.S. PATENT DOCUMENTS

| 4,514,440 | A | * | 4/1985 | Justice | C30B 31/02 136/261 |
| 2010/0059109 | A1 | * | 3/2010 | Nakayashiki | H01L 31/022425 136/255 |

(Continued)

FOREIGN PATENT DOCUMENTS

| JP | 04-369216 A | 12/1992 |
| JP | 09-232606 A | 9/1997 |

(Continued)

OTHER PUBLICATIONS

International Search Report; International Application No. PCT/JP2014/052104; dated Jan. 30, 2014. (Form PCT/ISA/210).
(Continued)

*Primary Examiner* — Reema Patel
(74) *Attorney, Agent, or Firm* — McDermott Will & Emery LLP

(57) ABSTRACT

The present invention provides a boron diffusion layer forming method capable of sufficiently oxidizing a boron silicide layer formed on a silicon substrate to remove it and obtaining a high-quality boron silicate glass layer. The present invention is a boron diffusion layer forming method of forming a boron diffusion layer on a silicon substrate by a boron diffusion process, the process including a first step of thermally diffusing boron on the silicon substrate and a second step of oxidizing a boron silicide layer formed on the (Continued)

silicon substrate at the first step, wherein the second step has a state at a temperature of 900° C. or higher and a treatment temperature at the first step or lower, for 15 minutes or more.

11 Claims, 14 Drawing Sheets

(51) Int. Cl.
    *H01L 21/223*     (2006.01)
    *H01L 31/068*     (2012.01)

(52) U.S. Cl.
    CPC ........ *H01L 31/1804* (2013.01); *Y02E 10/547* (2013.01); *Y02P 70/521* (2015.11)

(56) References Cited

U.S. PATENT DOCUMENTS

| | | | |
|---|---|---|---|
| 2010/0224251 A1 | 9/2010 | Funakoshi | |
| 2010/0267187 A1* | 10/2010 | Funakoshi | ........ H01L 31/02363 438/72 |
| 2010/0294333 A1* | 11/2010 | Wang | .................... H01L 31/028 136/244 |

FOREIGN PATENT DOCUMENTS

| | | | | |
|---|---|---|---|---|
| JP | 10-172913 | A | 6/1998 | |
| JP | 2870231 | * | 3/1999 | ............ C01B 35/02 |
| JP | 2870231 | B2 | 3/1999 | |
| JP | 3170445 | B2 | 5/2001 | |
| JP | 2001-313265 | A | 11/2001 | |
| JP | 2002-222973 | A | 8/2002 | |
| JP | 2002-299268 | A | 10/2002 | |
| JP | 2003-017428 | A | 1/2003 | |
| JP | 2006-024758 | A | 1/2006 | |
| JP | 2011-129867 | A | 6/2011 | |

OTHER PUBLICATIONS

PCT Written Opinion of the International Searching Authority; International Application No. PCT/JP2014/052104; International Filing Date: Jan. 30, 2014; dated May 13, 2014. (Form PCT/ISA/220 and PCT/ISA/237).

Kessler et al., "High-efficiency back-junction silicon solar cell with an in-line evaporated aluminum front grid," Photovoltaic Specialists Conference (PSVC), 2911 37th IEEE, IEEE, XP032167885, ISBN: 978-1-244-9966-3, Jun. 19, 2011, pp. 1085-1090.

Extended Search Report issued in European Application No. 14748501.5, dated Jul. 4, 2016.

\* cited by examiner (a)

(b)

(c)

(d)

(e)

(f)

(g)

(h)

US 9,837,575 B2

METHOD OF MANUFACTURING SOLAR BATTERY CELL

TECHNICAL FIELD

The present invention relates to a method of manufacturing a solar battery cell with a boron diffusion process. This application is based upon and claims the benefit of priority of the prior Japanese Patent Application No. 2013-021205, filed in Japan on Feb. 6, 2013, the entire contents of which are incorporated herein by reference.

BACKGROUND ART

Solar battery cells are semiconductor elements converting light energy to electric power and include a p-n junction type, a pin type, a Schottky type and so on, among which the p-n junction type is especially in wide use. Further, when solar batteries are classified based on a substrate material, they are roughly classified into three kinds, that is, a silicon crystal-based solar battery, an amorphous silicon-based solar battery, and a compound semiconductor-based solar battery. The silicon crystal-based solar batteries are further classified into a single crystal solar battery and a polycrystalline solar battery. Since a silicon crystal substrate for solar batteries can be relatively easily manufactured, the silicon crystal-based solar battery is most widely used.

A demand for solar batteries has recently been increased as a clean energy source, and accordingly, a demand for solar battery cells has also been increased. Further, in view of energy efficiency, it is desired that solar battery cells have as high conversion efficiency from light energy to electric power (hereinafter, also simply referred to as "conversion efficiency") as possible. As one of the solar battery cells, there is a double-sided light-receiving solar battery cell. The double-sided light-receiving solar battery cell can generate power by absorbing scattered light and reflected light through a cell back surface and thus improves in conversion efficiency as compared to that of a conventional single-sided light-receiving solar battery cell, but is demanded to further improve in conversion efficiency.

In the double-sided light-receiving solar battery cell, an n-type substrate is used, and thermal diffusion using boron as a diffusion source is used when forming a p+ layer in some cases. One of factors inhibiting the improvement in conversion efficiency of the double-sided light-receiving solar battery cell can be the fact that a boron silicide layer remains on a boron diffusion layer on a silicon substrate front surface in a manufacturing process of the solar battery cell. The boron silicide layer is formed when thermally diffusing boron on the silicon substrate.

Generally, the boron silicide layer formed on the silicon substrate is removed by once oxidizing the boron silicide layer to alter it to a boron silicate glass layer and then performing wet etching with a chemical such as a hydrofluoric acid (Patent Documents 1 to 3).

PRIOR ART DOCUMENT

Patent Document

[Patent Document 1] Japanese Patent Application Laid-open No. 2002-299268
[Patent Document 2] Japanese Patent Application Laid-open No. H09-232606
[Patent Document 3] Japanese Patent Application Laid-open No. 2011-129867

DISCLOSURE OF THE INVENTION

Problems to be Solved by the Invention

However, with the treatment conditions about the boron diffusion process described in Patent Documents 1 to 3, the boron silicide layer could not be sufficiently oxidized and has not been completely removed in some cases. For example, in Patent Document 1, treatment conditions for the oxidation process of altering the boron silicide layer to a boron silicate glass layer are exemplified. However, as illustrated in FIG. 5 and paragraph and so on of Patent Document 1, the boron silicide layer remains but cannot be removed under the treatment conditions.

Further, in the method of manufacturing the double-sided light-receiving solar battery cell, the boron silicate glass layer formed by oxidizing the boron silicide layer is sometimes made to function as a barrier layer that prevents phosphorus diffusion into a boron diffusion layer on the silicon substrate front surface in a phosphorus diffusion process that is the next process. However, if the oxidation of the boron silicide layer is insufficient, a boron silicate glass layer with a small film thickness and a low density comes to be formed, failing to sufficiently fulfilling the function as the barrier layer. For this reason, in the prior art, the boron silicate glass layer as a high-quality barrier layer has not been obtained and phosphorus has diffused into the boron diffusion layer on the silicon substrate front surface in some cases.

To solve the above problems, an object of the present invention is to provide a boron diffusion layer forming method capable of completely oxidizing a boron silicide layer formed on a silicon substrate to surely remove the boron silicide layer and obtaining a high-quality boron silicate glass layer, and to provide a method of manufacturing a solar battery cell.

Means for Solving the Problems

To solve the above problem, according to the present invention, there is provided a method of manufacturing a solar battery cell with a boron diffusion process, the process including a first step of thermally diffusing boron on the silicon substrate and a second step of oxidizing a boron silicide layer formed on the silicon substrate at the first step, wherein the second step has a state at a temperature of 900° C. or higher and a treatment temperature at the first step or lower, for 15 minutes or more.

Further, according to the present invention, there also is provided after completion of the boron diffusion process, wherein a process of removing a boron diffusion layer and a boron silicate glass layer which are unintentionally formed on a back surface of the silicon substrate, includes a process of forming a resist film on a front surface of the silicon substrate, then removing the boron diffusion layer and the boron silicate glass layer which are formed on the back surface of the silicon substrate by a chemical wet treatment, and then removing the resist film on the front surface of the silicon substrate.

Effect of the Invention

According to the present invention, it is possible to completely oxidize a boron silicide layer formed on a silicon substrate in a boron diffusion process. This makes it possible to remove the boron silicide layer more surely than before, and to form a boron silicate glass layer that is large in film thickness and dense, on a boron diffusion layer on the silicon substrate front surface.

MODE FOR CARRYING OUT THE INVENTION

Figure 1:
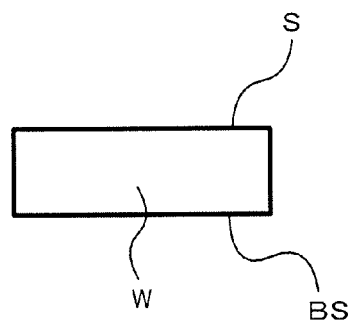
FIGS. 1(a) to (h) are explanatory views of a manufacturing process (texture structure formation to silicate glass layer etching) of a solar battery cell according to an embodiment of the present invention.
Figure 1:
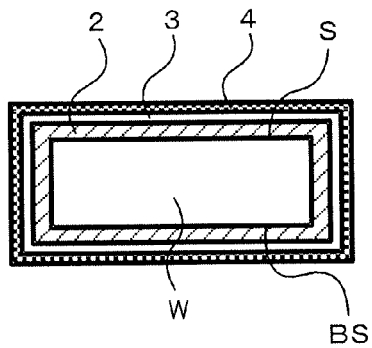
Figure 1:
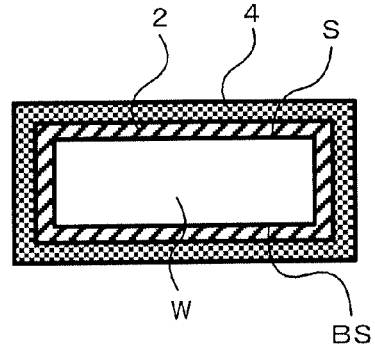
Figure 1:
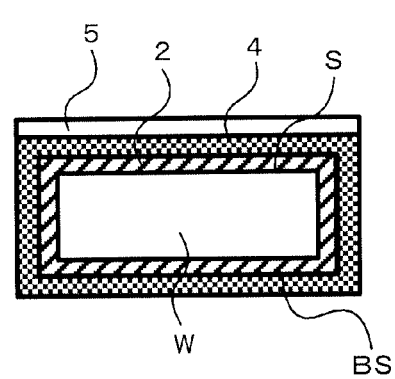
Figure 1:
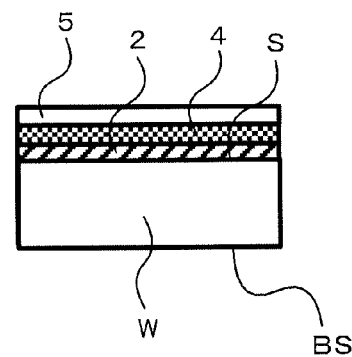
Figure 1:
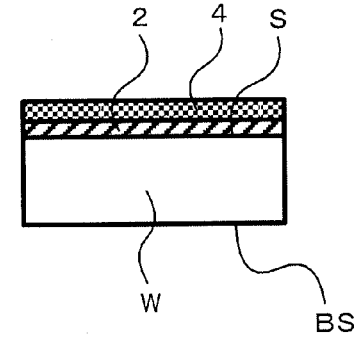
Figure 1:
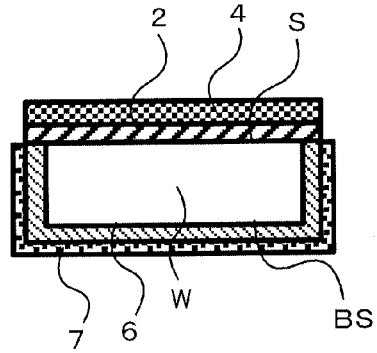
Figure 1:
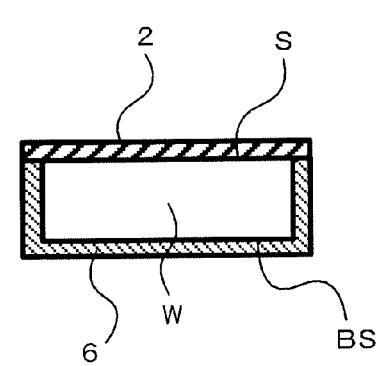

Hereinafter, an embodiment of the present invention will be described based on a manufacturing process of a solar battery cell. Note that in the description and the drawings, components having substantially the same functions and structures will be denoted by the same reference numerals and symbols, and a redundant description thereof will be omitted.

FIGS. 1(a) to (h) and FIGS. 2(a) to (d) are explanatory views of the manufacturing process of the solar battery cell. FIGS. 1(a) to (h) illustrate the manufacturing process from texture structure formation to silicate glass layer etching, and FIGS. 2(a) to (d) illustrate the manufacturing process from anti-reflection film formation to PN junction separation.

First, as illustrated in FIG. 1(a), an n-type silicon single crystal substrate W is prepared which has a crystal orientation (100) produced, for example, by a CZ method, a size of 15.6 cm square, a thickness of 100 to 300 μm, and a specific resistance of 1 to 14.0 Ω·cm.

Next, the substrate W is immersed in an aqueous sodium hydroxide solution of a high concentration (for example, 10 wt %), whereby a damaged layer is removed. Then, the substrate W is immersed in a solution made by adding isopropyl alcohol to an aqueous sodium hydroxide solution of a low concentration (for example, 2 wt %) and thereby subjected to wet etching. Thus, a texture structure is formed on the entire front surface of the substrate W. Thereafter, the substrate W is cleaned. Note that the size of each peak of the texture structure is about 0.3 to about 20 μm. Further, in order to form the texture structure, for example, acid etching, reactive ion etching or the like may be performed instead of the above-described method.

Next, a boron diffusion process of diffusing boron on the substrate W on which the texture structure has been formed, will be described. The boron diffusion process is composed of a first step of diffusing boron on a front surface S of the substrate W, and a second step of oxidizing a boron silicide layer formed on the substrate W.

(Boron Diffusion Process-first Step)

Figure 3:
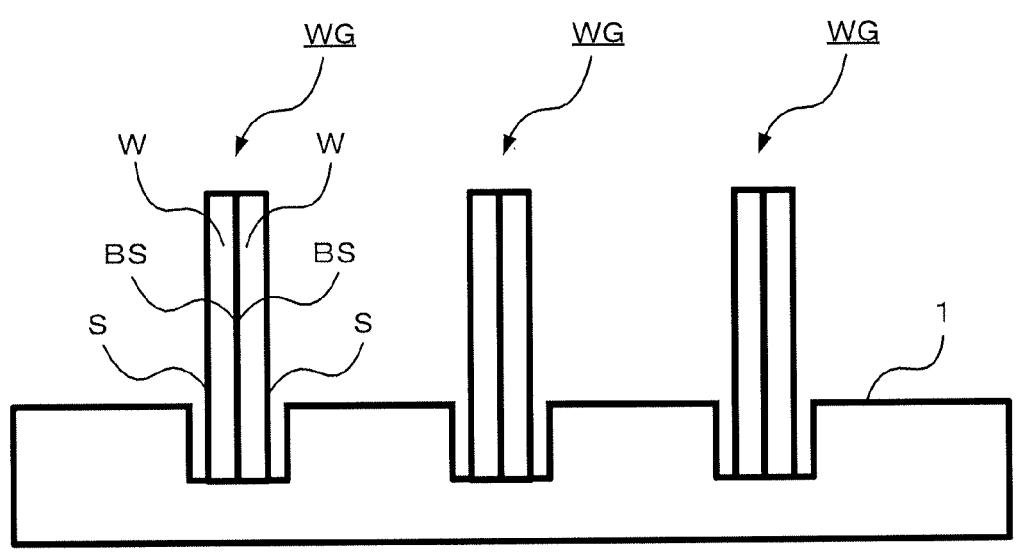
FIG. 3 is a view illustrating an arrangement state of a substrate in a diffusion furnace in a boron diffusion process.

As illustrated in FIG. 3, a plurality of substrate groups WG are placed at predetermined positions, one substrate group WG being composed of two substrates W with back surfaces BS thereof in abutment with each other. Then, a wafer boat 1 is carried into a diffusion furnace, and the diffusion furnace is sealed. Then, the temperature in the diffusion furnace is increased up to 950° C. Then, boron tribromide ($BBr_3$) is introduced into the diffusion furnace using a mixed gas of nitrogen and oxygen as a carrier gas. In this event, the carrier gas is adjusted so that the flow rate ratio between nitrogen and oxygen in the atmosphere in the diffusion furnace is within a range of 99.5:0.5 to 95:5. Such a state is kept for 5 to 120 minutes, whereby boron diffusion is performed (boron diffusion process-first step).

Thus, a boron diffusion layer 2 is formed on the front surface S of the substrate W as illustrated in FIG. 1(b). In this event, a boron silicide layer 3 and a boron silicate glass layer 4 are also formed on the boron diffusion layer on the substrate W. In the boron diffusion process as described above, the diffusion treatment is performed with the back surfaces BS of the two substrates W are in abutment with each other, but a slight gap exists between the back surfaces BS of the two substrates W. Therefore, a boron tribromide ($BBr_3$) gas gets into the gap between the back surfaces BS of the substrates W, so that the boron diffusion layer 2, the boron silicide layer 3, and the boron silicate glass layer 4 are formed not only on the front surface S of the substrate W but also on the back surface BS as illustrated in FIG. 1(b).

Note that the temperature during the boron diffusion is preferably 920 to 1050° C. This is because when the temperature during the boron diffusion is lower than 920° C., the boron diffusion to the substrate W is insufficient, whereas when the temperature exceeds 1050° C., the boron diffusion to the substrate W is excessive. In such cases, a boron diffusion layer having a desired sheet resistance cannot be obtained. Note that in terms of further improving the conversion efficiency of a solar battery, the sheet resistance value is preferably 30 to 150 Ω/□.

Further, in the case where the flow rate ratio between nitrogen and oxygen in the atmosphere in the diffusion furnace is outside the range of 99.5:0.5 to 95:5, namely, in the case where the flow rate of nitrogen is larger than that when the flow rate ratio between nitrogen and oxygen becomes 99.5:0.5, and in the case where the flow rate of nitrogen is smaller than that when the flow rate ratio between nitrogen and oxygen becomes 95:5, a boron diffusion layer having a desired sheet resistance cannot be obtained. Similarly, also in the case where the diffusion treatment time is less than 5 minutes and in the case where it is more than 120 minutes, a boron diffusion layer having a desired sheet resistance cannot be obtained.

(Boron Diffusion Process-second Step)

After completion of the boron diffusion treatment (first step), the atmosphere in the diffusion furnace is exhausted and an oxidizing gas (for example, oxygen, ozone, nitrogen dioxide or the like) is introduced into the diffusion furnace. In this event, the temperature in the diffusion furnace is adjusted so that the temperature for the boron diffusion treatment (first step) (950° C. in this embodiment) is kept. After bringing the inside of the diffusion furnace into an oxidizing atmosphere, the substrates W are retained therein for example, for 15 minutes, then the temperature is lowered, and the substrates W are taken out of the diffusion furnace. During this retention time and temperature decrease, the boron silicide layer 3 formed on the substrate W is oxidized (boron diffusion process-second step).

However, if the temperature for the oxidation treatment is lower than 900° C., the oxidation speed of the boron silicide layer 3 decreases, resulting in failure to sufficiently oxidize the boron silicide layer 3 even if the oxidation treatment is performed for a long time. Therefore, the lower limit of the temperature for the oxidation treatment is preferably 900° C.

Further, if the temperature for the oxidation treatment is made higher than the treatment temperature for the boron diffusion treatment (first step), it becomes possible to more surely oxidize the boron silicide layer 3 and thereby obtain a denser boron silicate glass layer 4. However, when the temperature for the oxidation treatment becomes higher than the treatment temperature for the boron diffusion treatment (first step), boron diffusion to the substrate W proceeds even during the oxidation treatment and therefore the boron diffusion layer becomes thicker, resulting in failure to obtain a desired sheet resistance.

Therefore, in the present invention, the upper limit of the temperature for the oxidation treatment is set to the treatment temperature for the boron diffusion treatment (first step) in terms of improvement in performance of the solar battery cell.

However, even if the temperature for the oxidation treatment is 900° C. or higher and the temperature for the boron diffusion treatment (first step) or lower, it is impossible to sufficiently oxidize the boron silicide layer 3 when the oxidation treatment time is short. To solve the problem, the present inventors have found that it is possible to sufficiently oxidize the boron silicide layer 3 by securing 15 minutes or more as the time when the treatment temperature is within the above-described temperature range in the oxidation treatment process (second step).

More specifically, even during temperature decrease as well as when the substrate W is retained at a fixed temperature in the above-described temperature range for 15 minutes or more, it is possible to sufficiently oxidize the boron silicide layer 3 by securing 15 minutes or more as the time when the temperature in the furnace is within the above-described temperature range under the oxidizing atmosphere, even in the case where the temperature in the furnace becomes outside the above-described temperature range or the case where the atmosphere in the furnace becomes a non-oxidizing atmosphere.

Note that the oxidation treatment time is preferably 20 minutes or more. On the other hand, the oxidation treatment time exceeding 120 minutes is not practical because the boron diffusion process becomes long in time and poor in productivity. For this reason, the upper limit of the oxidation treatment time is preferably 120 minutes.

As the result of the above-described oxidation treatment, the boron silicide layer 3 formed on the substrate W is altered to the boron silicate glass layer 4 as illustrated in FIG. 1(c). The film thickness of the boron silicate glass layer 4 formed in this event is preferably 100 to 200 nm. When the film thickness is within this range, the boron silicate glass layer 4 can sufficiently fulfill a function as a barrier layer in a later-described phosphorus diffusion process.

Note that the boron silicide layer 3 cannot be removed by a later-described wet etching using a hydrofluoric acid or a mixed solution of a hydrofluoric acid and a nitric acid or the like, and therefore it is necessary to sufficiently oxidize the boron silicide layer 3 in this oxidation process. This makes it possible to surely remove the boron silicide layer 3 and form a high-quality boron silicate glass layer 4 on the boron diffusion layer on the substrate front surface S. On the other hand, when the oxidation is insufficient, the boron silicide layer 3 remains on the substrate W, resulting in lowering of the performance (conversion efficiency or the like) of the solar battery cell.

Next, a resist film 5 is formed on the front surface S of the substrate W as illustrated in FIG. 1(d). Note that the thickness of the resist film 5 is, for example, about 10 to 30 μm. As the resist film 5, a material having hydrofluoric acid resistance and nitric acid resistance and peelable by an alkaline solution is preferably used.

Next, the substrate W is immersed in a hydrofluoric acid or a mixed solution of a hydrofluoric acid and a nitric acid or the like and thereby subjected to wet etching. This removes the boron diffusion layer 2 and the boron silicate glass layer 4 which are formed on the back surface BS of the substrate W as illustrated in FIG. 1(e). In this event, the boron diffusion layer 2 and the boron silicate glass layer 4, which are formed on the front surface S of the substrate W, are protected by the resist film 5 and therefore are not removed by the etching. Thereafter, as illustrated in FIG. 1(f), the resist film 5 is removed using, for example, an aqueous sodium hydroxide solution. After completion of the removal of the resist film 5, cleaning and drying of the substrate W are performed. Note that the cleaning is desirably performed using a mixed solution of a hydrochloric acid (HCl) and a hydrogen peroxide solution ($H_2O_2$).

Next, the substrate W is placed on the wafer boat 1 one by one and carried again into the diffusion furnace. Thereafter, the temperature in the diffusion furnace is increased up to, for example, 870° C. Then, a phosphorus oxychloride ($POCl_3$) gas and an oxygen gas are introduced into the diffusion furnace to bring the inside of the diffusion furnace into an atmosphere of the phosphorus oxychloride ($POCl_3$) gas and the oxygen gas. By keeping the state for a predetermined time, a phosphorus diffusion layer 6 is formed on the back surface BS of the substrate W as illustrated in FIG. 1(g). In this event, on the phosphorus diffusion layer, a phosphorus silicate glass layer 7 is also formed. Note that the substrate W to be placed on the wafer boat 1 in the phosphorus diffusion process may be arranged such that the front surfaces S of two substrates W are brought into abutment with each other.

Further, in the phosphorus diffusion process, the boron silicate glass layer 4 formed on the boron diffusion layer of the substrate front surface S functions as a barrier layer that prevents phosphorus diffusion to the boron diffusion layer 2. Therefore, phosphorus never diffuses in the boron diffusion layer 2 formed on the front surface S of the substrate W. Thus, a high-quality boron diffusion layer 2 can be obtained.

Thereafter, as illustrated in FIG. 1(h), the boron silicate glass layer 4 formed on the front surface S of the substrate W and the phosphorus silicate glass layer 7 formed on the back surface BS of the substrate W are immersed in a hydrofluoric acid or a mixed solution of a hydrofluoric acid and a nitric acid or the like and thereby removed.

Figure 2:
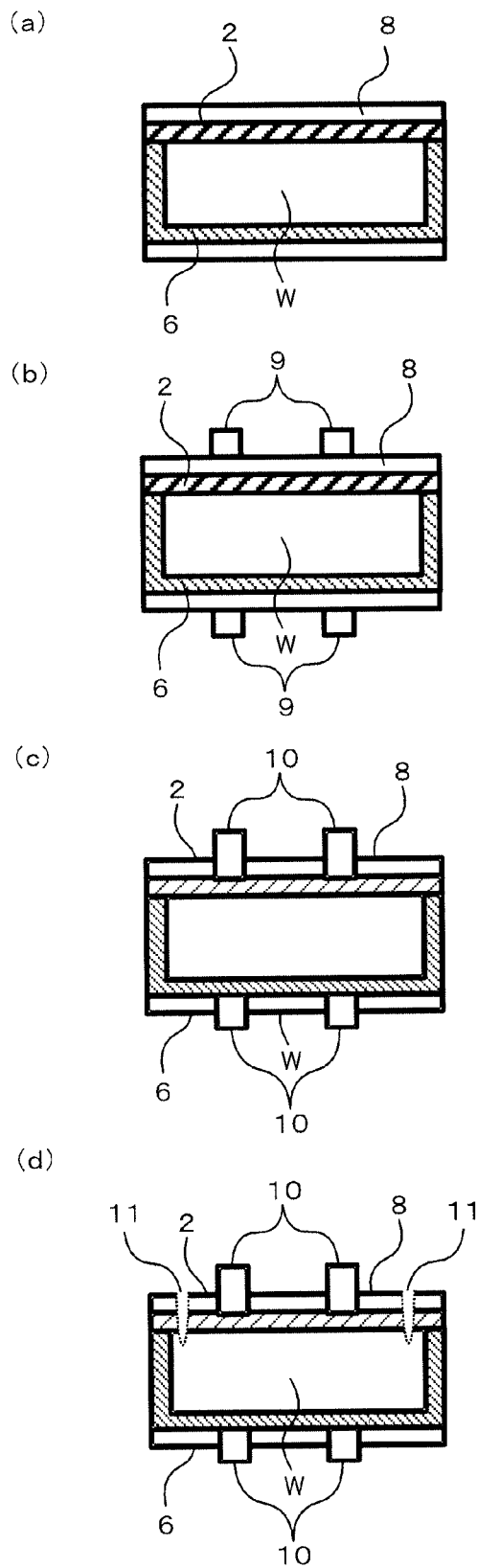
FIGS. 2(a) to (d) are explanatory views of the manufacturing process (antireflection film formation to PN junction separation) of the solar battery cell according to the embodiment of the present invention.

Next, as illustrated in FIG. 2(a), an antireflection film 8 being a nitride film (SiNx film) is formed on the substrate W by a plasma CVD apparatus. Note that as the antireflection film 8, for example, a titanium dioxide film, a zinc oxide film, a tin oxide film or the like may be formed. Further, the antireflection film 8 may be formed using, for example, a remote plasma CVD method, a coating method, a vacuum deposition method or the like. However, it is best to form the nitride film by the plasma CVD method in terms of quality and economy. Furthermore, it is preferable to from a film having a refractive index of between 1 and 2 such as a magnesium difluoride film on the antireflection film to make the total reflectance the smallest. This makes it possible to promote reduction in reflectance so as to increase the density of generated current. Further, an insulating film for passivation may also be formed between the substrate W and the anti-reflection film 8.

Subsequently, as illustrated in FIG. 2(b), a conductive paste 9 containing, for example, Ag is printed in a predetermined pattern on the anti-reflection film on the back surface BS side of the substrate W by using a screen printer and then is dried. Similarly, the conductive paste 9 is printed also on the anti-reflection film on the front surface S side of the substrate W and then is dried.

Next, the conductive paste 9 is fired at a temperature of 700° C. or higher in a firing furnace. Thus, the conductive paste 9 electrically conducts with the substrate W to form into an Ag grid electrode 10 as illustrated in FIG. 3(c).

Then, PN junction separation of a peripheral portion 11 of the substrate W is performed by using a laser as illustrated in FIG. 2(d). This electrically separates the font surface side and the back surface side of the substrate W. Thereafter, through an inspection process, the manufacturing process of the solar battery cell ends.

In conclusion, according to the present invention, performing the boron diffusion process under predetermined treatment conditions makes it possible to completely oxidize the boron silicide layer formed on the silicon substrate. This makes it possible to surely remove the boron silicide layer and form a boron silicate glass layer that is large in film thickness and dense, on the silicon substrate front surface.

Further, in the case of manufacturing a solar battery cell using the above-described silicon substrate on which the boron diffusion layer is formed, sufficient removal of the boron silicide layer makes it possible to form a high-quality phosphorus diffusion layer on the back surface of the silicon substrate. In addition to this, in the phosphorus diffusion process, the boron silicate glass layer formed on the boron diffusion layer on the silicon substrate front surface functions as a barrier layer that prevents phosphorus diffusion into the boron diffusion layer. Thus, a high-quality boron diffusion layer can be obtained. As a result, the conversion efficiency of the solar battery can be improved.

Hitherto, a preferable embodiment of the present invention has been described, but the present invention is not limited to the embodiment. It should be understood that various changes and modifications are readily apparent to those skilled in the art within the scope of the technical ideas as set forth in claims, and those should also be covered by the technical cops of the present invention.

Figure 4:
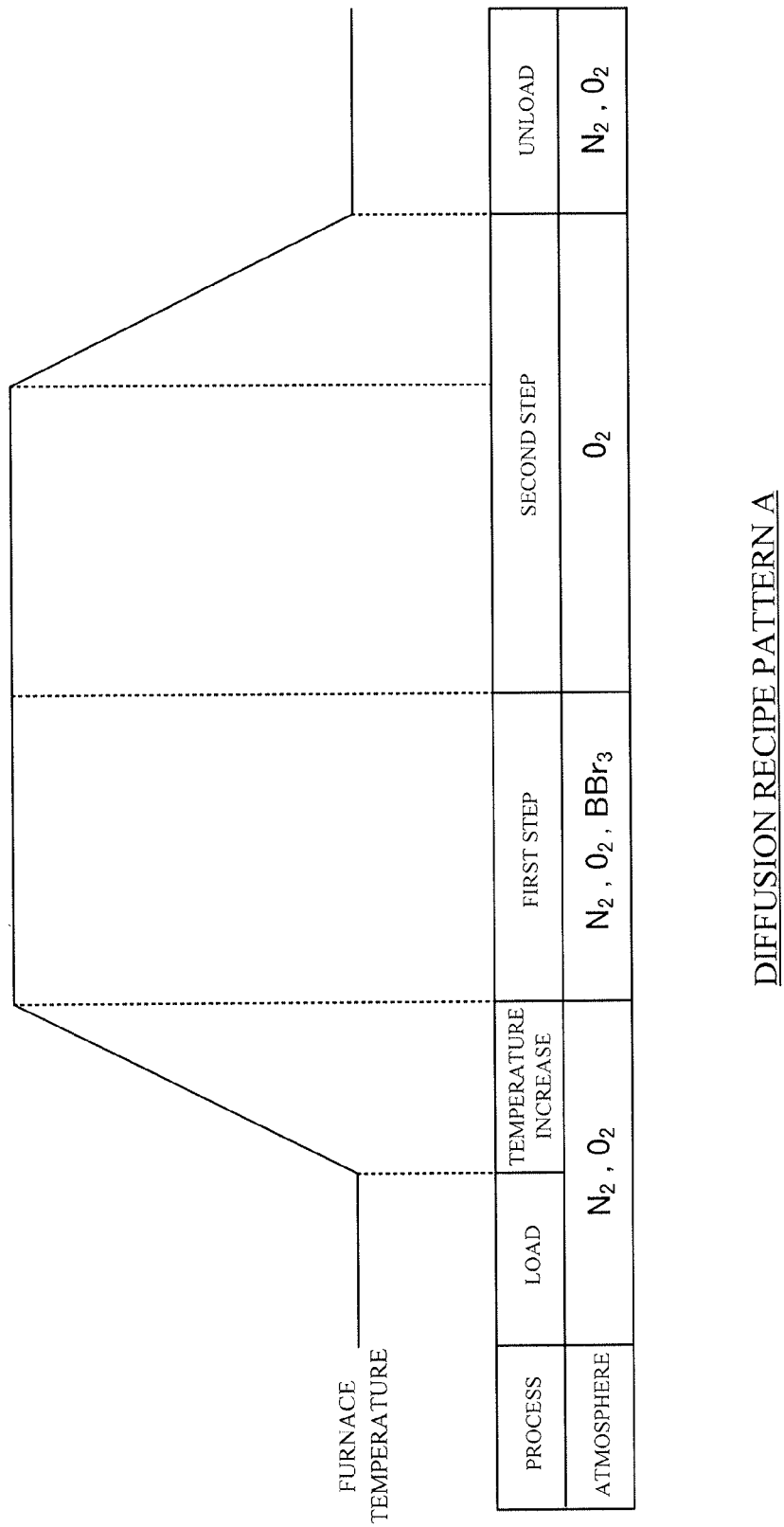
FIG. 4 is a chart illustrating a diffusion recipe pattern A.
Figure 5:
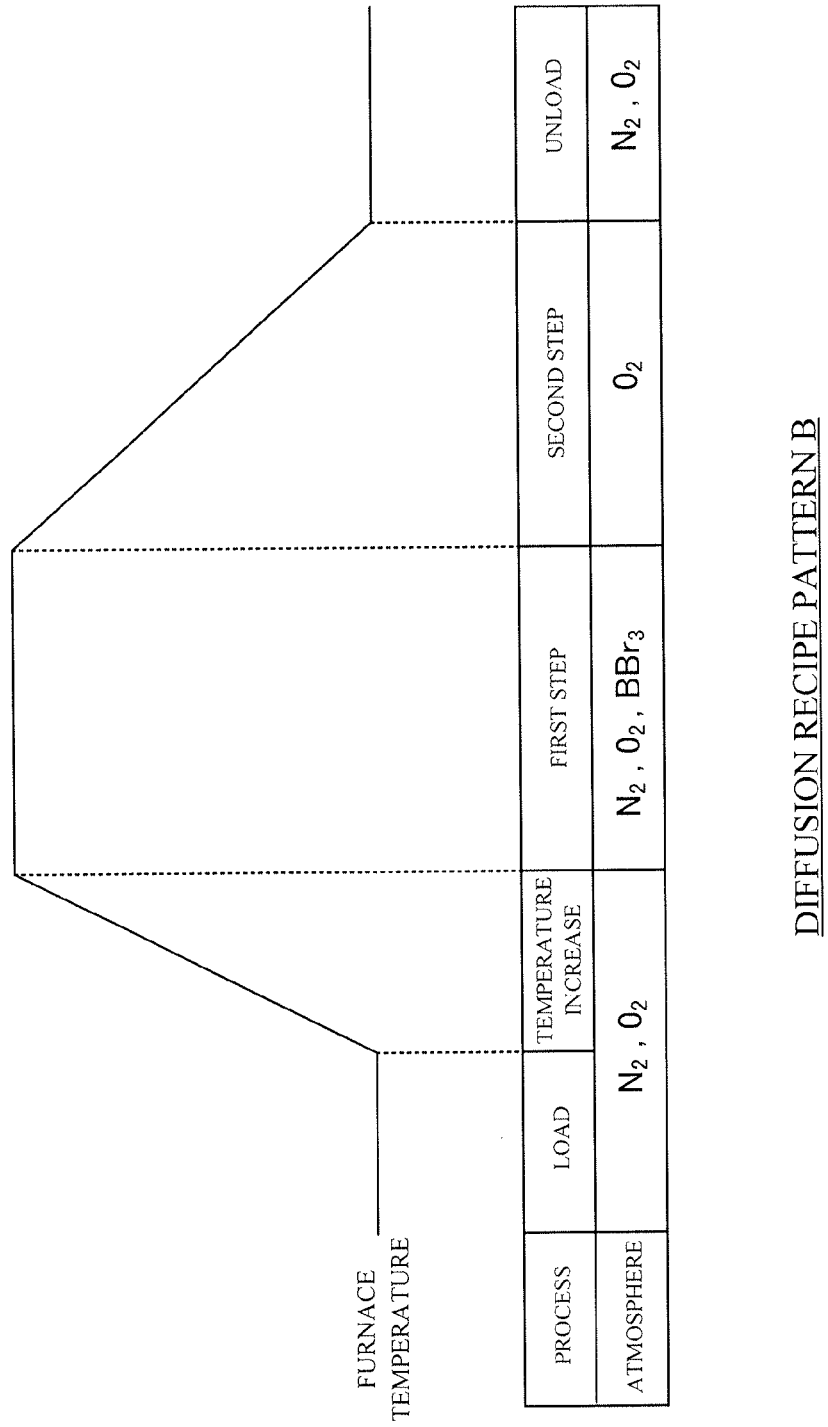
FIG. 5 is a chart illustrating a diffusion recipe pattern B.
Figure 6:
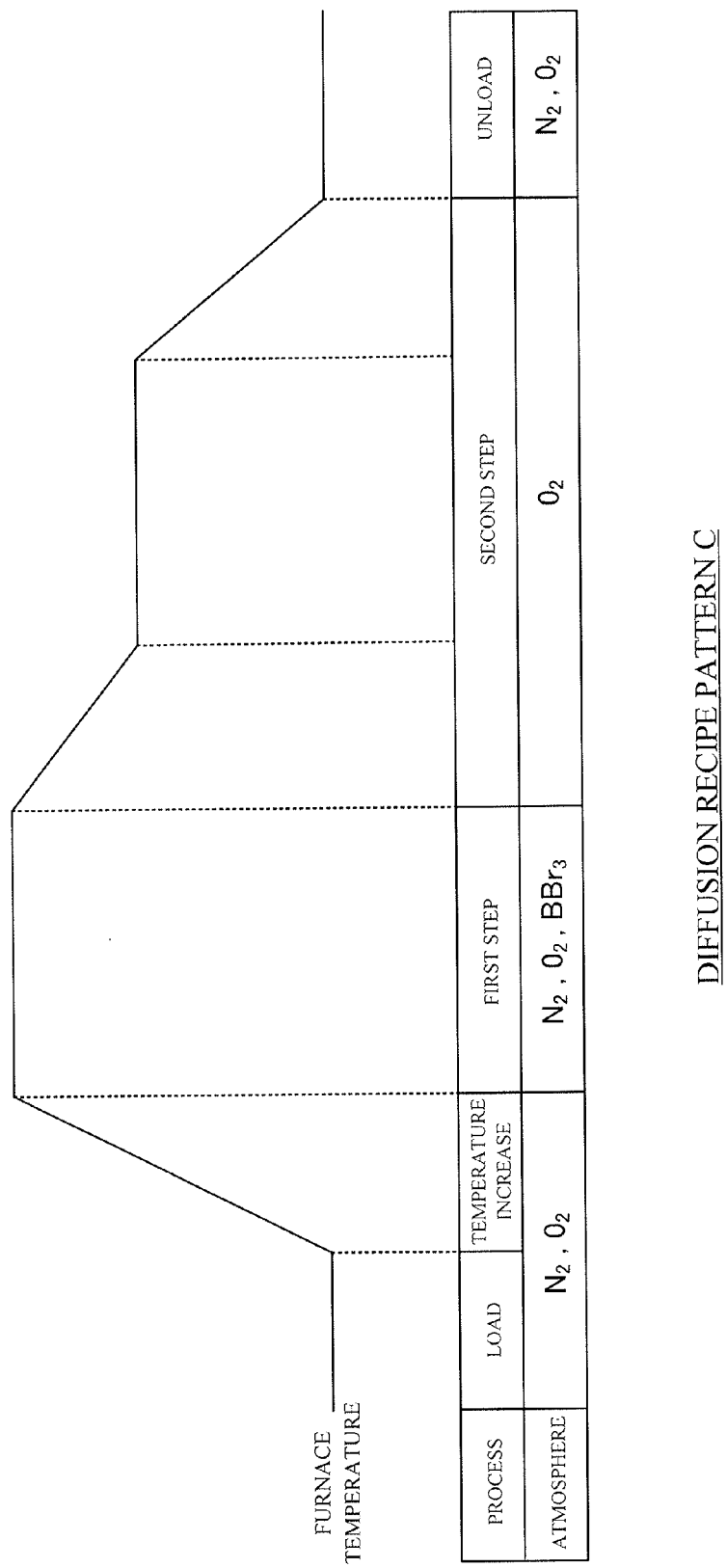
FIG. 6 is a chart illustrating a diffusion recipe pattern C.
Figure 7:
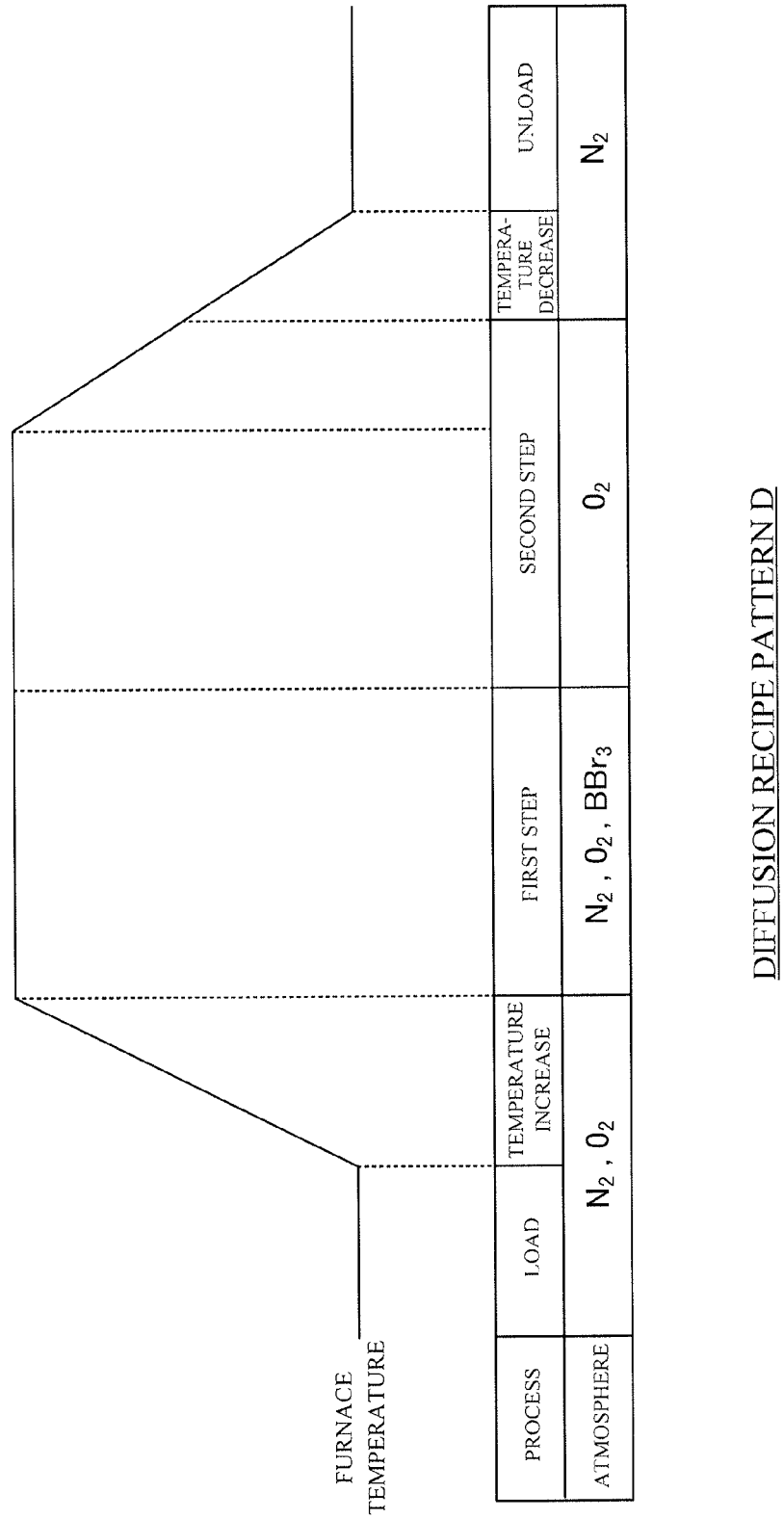
FIG. 7 is a chart illustrating a diffusion recipe pattern D.

For example, in the embodiment of the present invention, at the second step (oxidation treatment), the temperature in the diffusion furnace is kept and then the second step (oxidation treatment) is performed while the temperature is being decreased as in a diffusion recipe pattern A illustrated in FIG. 4. However, the second step (oxidation treatment) is not limited to this method but may be performed while the temperature is being decreased as in a diffusion recipe pattern B illustrated in FIG. 5. Alternatively, at the second step (oxidation treatment), the temperature is decreased from the treatment temperature for the first step (boron diffusion treatment) to a temperature not lower than 900° C., then the temperature in the diffusion furnace is kept at a fixed temperature, and then the second step (oxidation treatment) may be performed while the temperature is being decreased again as in a diffusion recipe pattern C illustrated in FIG. 6. Alternatively, the temperature in the diffusion furnace is kept, then the second step (oxidation treatment) is performed while the temperature is being decreased, then the atmosphere in the furnace may be changed to a non-oxidizing atmosphere, and the temperature may be decreased as in a diffusion recipe pattern D illustrated in FIG. 7. Also in this case, the boron silicide layer can be oxidized at the second step (oxidation treatment).

The diffusion recipe pattern is not limited to the above A to D, but the boron silicide layer can be completely oxidized in any recipe pattern as long as the second step has the state at 900° C. or higher and the treatment temperature at the first step or lower for the first step for 15 minutes or more.

Further, though the boron tribromide ($BBr_3$) gas is introduced in the diffusion process in the embodiment of the present invention, the gas is not limited to this but boron trichloride ($BCl_3$) or the like can also be used. Further, the diffusion method of boron is not limited to the gas diffusion method, but may be a solid-phase diffusion method using BN (boron nitride) as a source or a coating-diffusion method using screen printing, inkjet printing, spray, spin coat or the like.

EXAMPLE 1

Figure 8:
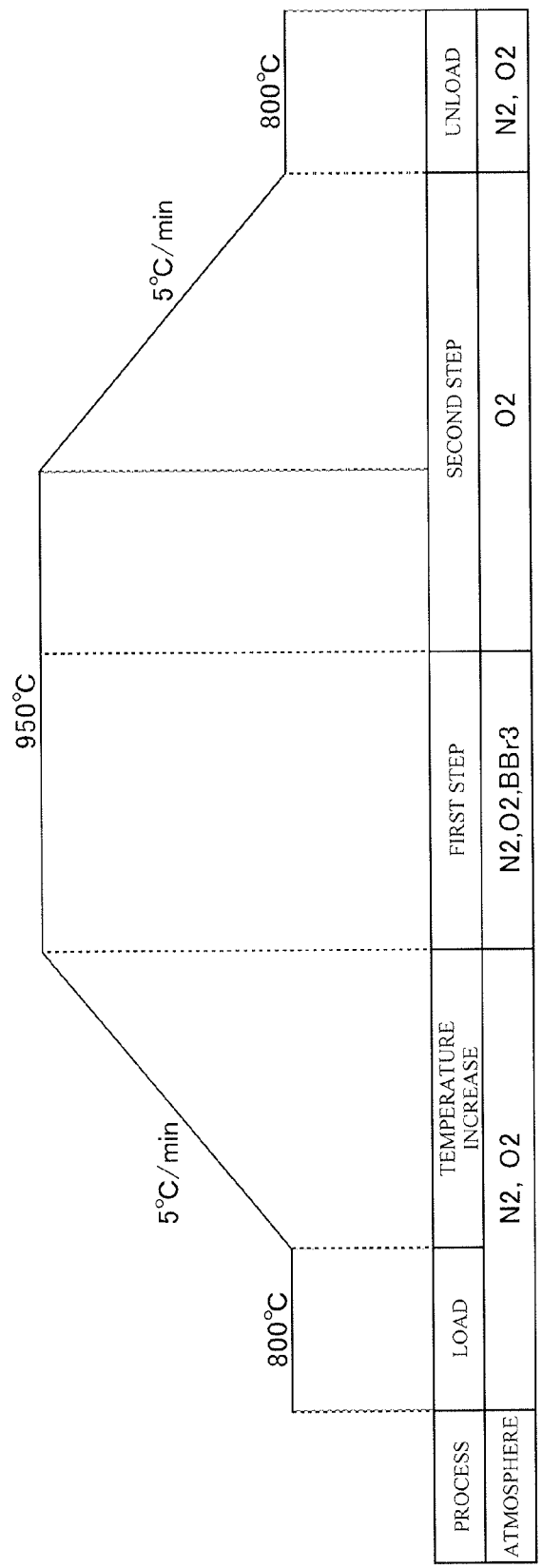
FIG. 8 is a chart for explaining the temperature and the atmosphere in the boron diffusion process in Present Invention Example.
Figure 9:
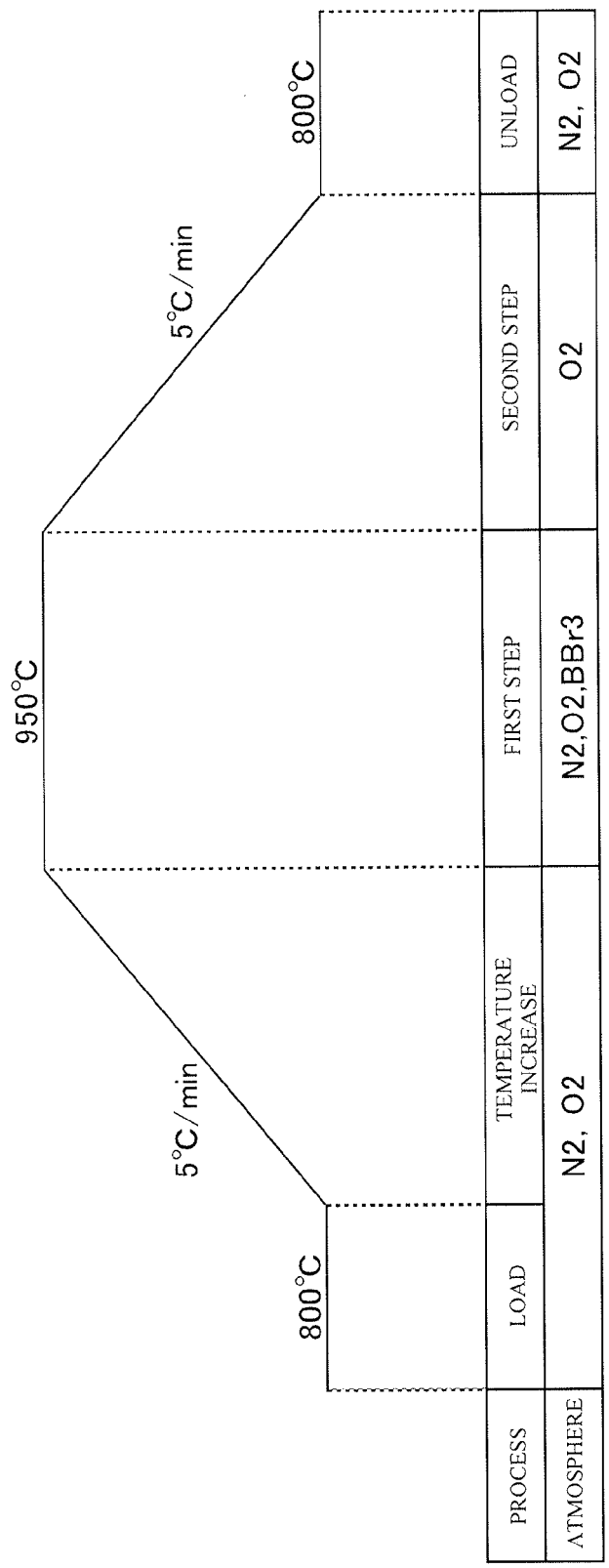
FIG. 9 is a chart for explaining the temperature and the atmosphere in the boron diffusion process in Comparative Example 1.
Figure 10:
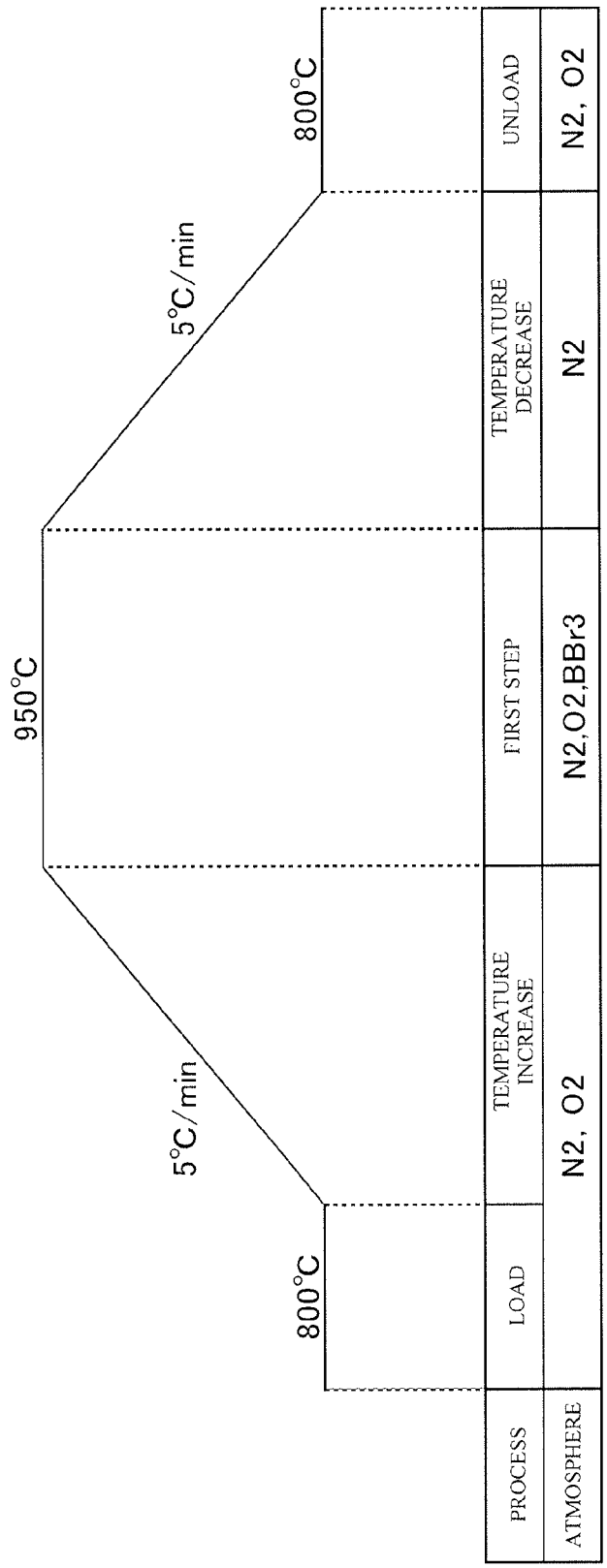
FIG. 10 is a chart for explaining the temperature and the atmosphere in the boron diffusion process in Comparative Example 2.
Figure 11:
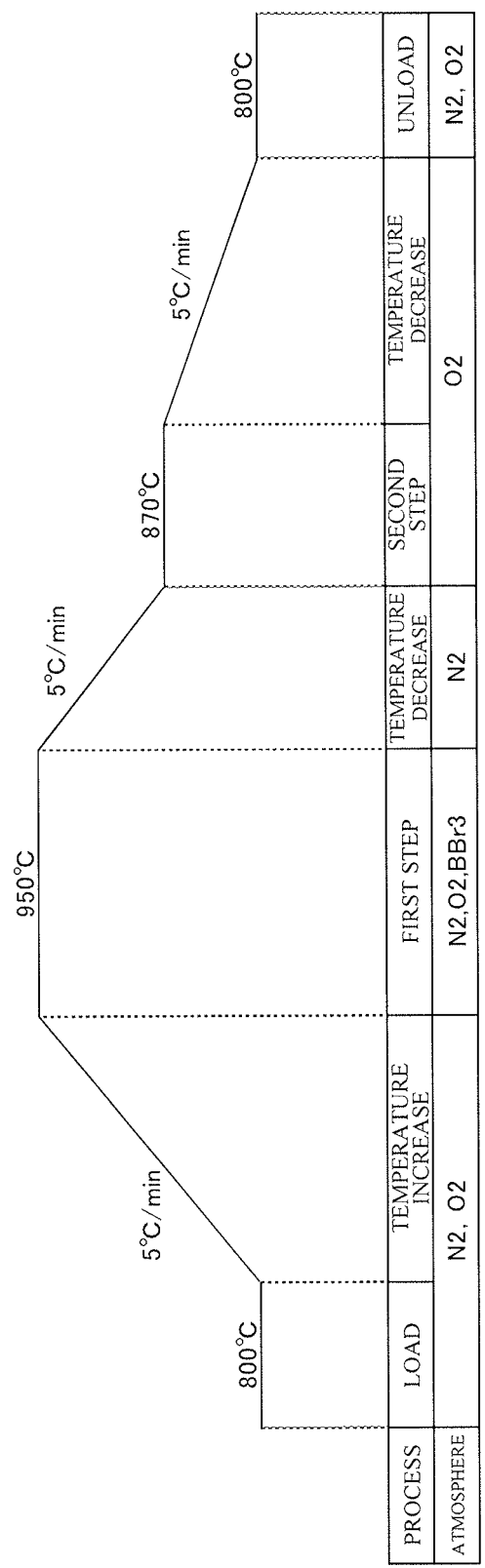
FIG. 11 is a chart for explaining the temperature and the atmosphere in the boron diffusion process in Comparative Example 3.

Performances of a double-sided light-receiving solar battery cell (Present Invention Example) manufactured using the silicon substrate on which the boron diffusion layer was formed by the present invention and conventional double-sided light-receiving solar battery cells (Comparative Examples 1 to 3) were compared. Their results are listed in Table 1. Note that the details of the treatment conditions are as follows. Further, FIG. 8 is an explanatory view for explaining the temperature and the atmosphere in the boron diffusion process in one embodiment made by embodying Present Invention Example. FIG. 9 to FIG. 11 are explanatory views for explaining the temperature and the atmosphere in the boron diffusion process in Comparative Example 1 to Comparative Example 3.

The "treatment atmosphere, treatment temperature, treatment time" at the first step (diffusion process) in the boron diffusion process of Present Invention Example and Comparative Examples 1 to 3 were set to "a flow rate ratio between nitrogen and oxygen of 98:2, 950° C., 30 minutes" respectively. Further, the treatment conditions at the second step (oxidation treatment) in Present Invention Example and Comparative Example 1 and Comparative Example 3 were set such that "the substrate W was retained at 950° C. for 15 minutes and then the temperature was decreased from 950° C. to 800° C. at 5° C./min (FIG. 8)" in Present Invention Example, "the temperature was decreased from 950° C. to 800° C. at 5° C./min (FIG. 9)" in Comparative Example 1, and "the temperature was decreased to 870° C. at 5° C./min in a non-oxidizing atmosphere (nitrogen 100%), then the substrate W was retained in an oxidizing atmosphere (oxygen 100%), and then the temperature was decreased from 870° C. to 800° C. at 5° C./min (FIG. 11)" in Comparative Example 3. Note that in Comparative Example 2, the second step was not performed, and after the completion of the first step, "the temperature was decreased from 950° C. to 800° C. at 5° C./min in a non-oxidizing atmosphere (nitrogen 100%) (FIG. 10)."

TABLE 1

|  | Eff. [%] | Voc[mV] | Isc[A] | FF[%] |
|---|---|---|---|---|
| PRESENT INVENTION EXAMPLE | 19.64 | 645.7 | 9.16 | 79.33 |
| COMPARATIVE EXAMPLE 1 | 19.15 | 640.7 | 9.15 | 78.07 |
| COMPARATIVE EXAMPLE 2 | 19.00 | 637.3 | 9.13 | 78.01 |
| COMPARATIVE EXAMPLE 3 | 19.28 | 643.5 | 9.12 | 78.52 |

As listed in Table 1, the conversion efficiency (Eff.) of the solar battery cell is improved in Present Invention Example and Comparative Example 1 and Comparative Example 3, in which the second step (oxidation treatment) was performed, more than in Comparative Example 2 in which the second step (oxidation treatment) was not performed. It is considered that the reason is that the boron silicide layer formed on the silicon substrate could be completely removed by performing the second step (oxidation treatment) in Present Invention Example, and the boron silicide layer could not be completely removed in Comparative Example 2.

Further, comparing Present Invention Example and Comparative Example 1, the conversion efficiency of the solar battery cell is greatly improved. It is considered that the reason why the conversion efficiency in Comparative Example 1 is low is that the time when the temperature at the second step in Comparative Example 1 was at equal to or higher than 900° C. that is the lower limit value of the temperature defined by the present invention was short to fail to sufficiently oxidize the boron silicide layer. In short, in consideration of the fact that the temperature decreasing rate during temperature decrease was 5° C./min, the time when the temperature was 900° C. or higher is about 10 minutes in Comparative Example 1, which seems insufficient as oxidation time.

On the other hand, in Present Invention Example, since the substrate W was retained at 950° C. for 15 minutes and then the temperature was decreased at a temperature decreasing rate of 5° C./min, the time when the temperature was 900° C. or higher is about 25 minutes. It is presumed that in Present Invention Example, securing a sufficient time when the temperature was 900° C. or higher made it possible to completely oxidize the boron silicide layer, resulting in performance difference generated between the solar battery cells in Present Invention Example and Comparative Example 1.

Further, in Comparative Example 3, since the substrate was retained at 870° C. for 10 minutes, then the temperature was decreased from 870° C. to 800° C. at 5° C./min, and then the substrate was unloaded, the treatment time (oxidation treatment time) of the second step is about 24 minutes. Therefore, in Comparative Example 3, a long enough oxidation treatment time is secured. Nevertheless, the conversion efficiency in Comparative Example 3 is low as compared with the conversion efficiency in Present Invention Example.

It is conceivable that the reason why the conversion efficiency in in Comparative Example 3 is low is that the temperature at the second step in Comparative Example 3 was lower than 900° C. being the lower limit value of the temperature defined by the present invention and therefore the boron silicide layer could not be sufficiently oxidized. In short, even if the oxidation treatment was performed for a sufficiently long time as in Comparative Example 3, the conversion efficiency cannot be improved when the oxidation treatment temperature is lower than 900° C.

EXAMPLE 2

Figure 12:
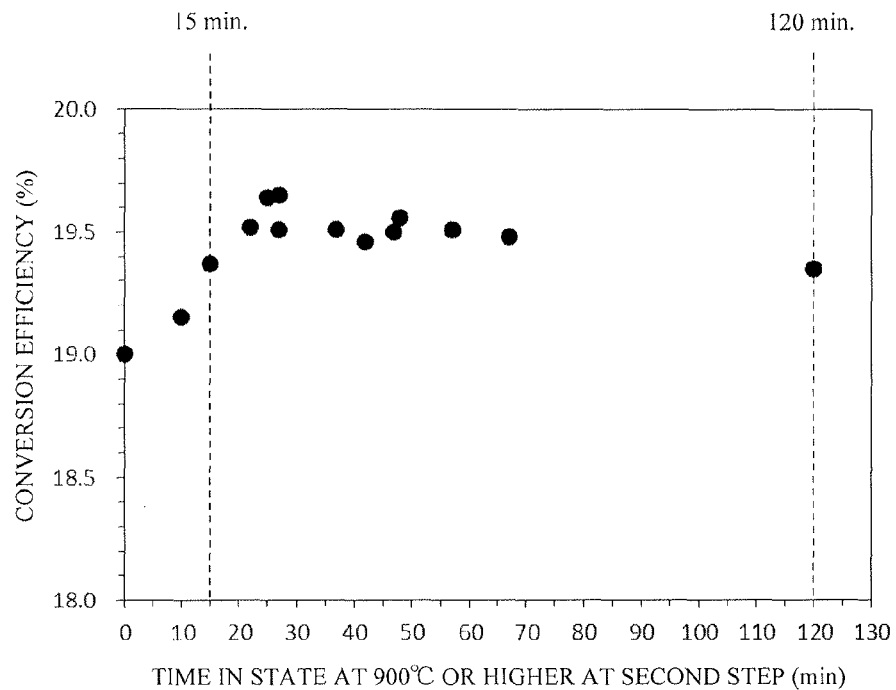
FIG. 12 is a chart illustrating the relationship between the time in a state at 900° C. or higher at a second step and the conversion efficiency of the solar battery cell.

Next, the relationship between the time in the state at 900° C. or higher at the second step and the conversion efficiency of the solar battery cell was examined. Its result is illustrated in FIG. 12. Note that the treatment conditions other than the treatment time of the second step are almost equal conditions. As illustrated in FIG. 12, by setting the time in the state at 900° C. or higher at the second step to at least 15 minutes, the conversion efficiency can be improved as compared with the result in the case of the treatment time of about 10 minutes. Therefore, it is necessary to secure 15 minutes or more as the treatment time of the second step. Further, by securing 20 minutes or more, the conversion efficiency can be further improved.

Consequently, according to the results of Example 1 and Example 2, it is found that by keeping the state at a temperature of 900° C. or higher and the treatment temperature at the first step for 15 or lower minutes or more, the conversion efficiency of the solar battery cell can be improved.

EXAMPLE 3

Figure 13:
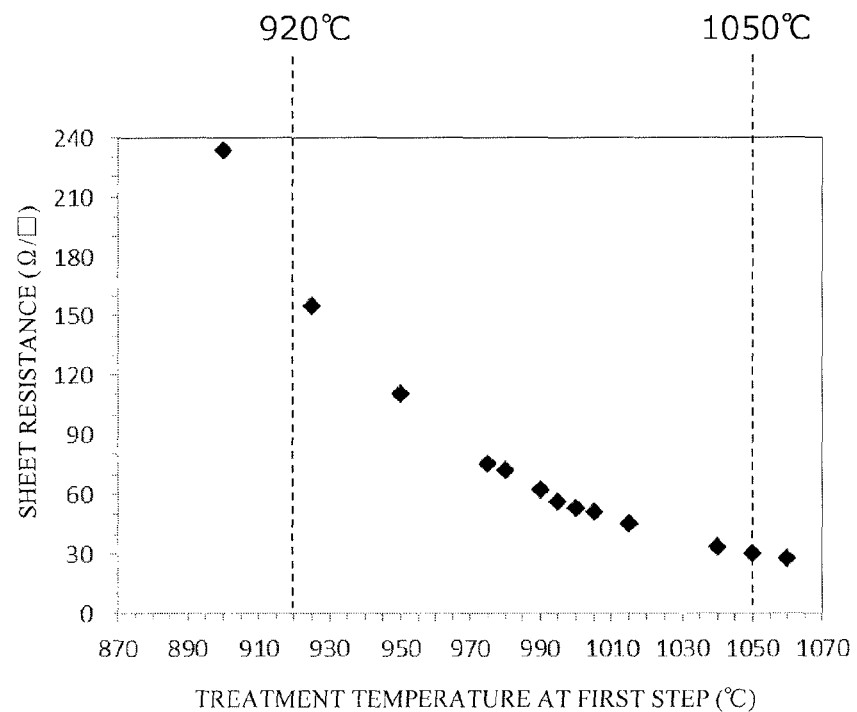
FIG. 13 is a chart illustrating the relationship between the treatment temperature at a first step and the sheet resistance value of the solar battery cell.

Next, the relationship between the treatment temperature at the first step and the sheet resistance value of the solar battery cell was examined. Its result is illustrated in FIG. 13. Note that the treatment conditions other than the treatment temperature at the first step are almost equal conditions. As illustrated in FIG. 13, it is found that when the treatment temperature at the first step is within a range of 920° C. to 1050° C., the sheet resistance value falls within a preferable range (30 to 150Ω/□) for further improving the conversion efficiency of the solar battery cell. Accordingly, the treatment temperature at the first step preferably is within the range of 920° C. to 1050° C.

EXAMPLE 4

Figure 14:
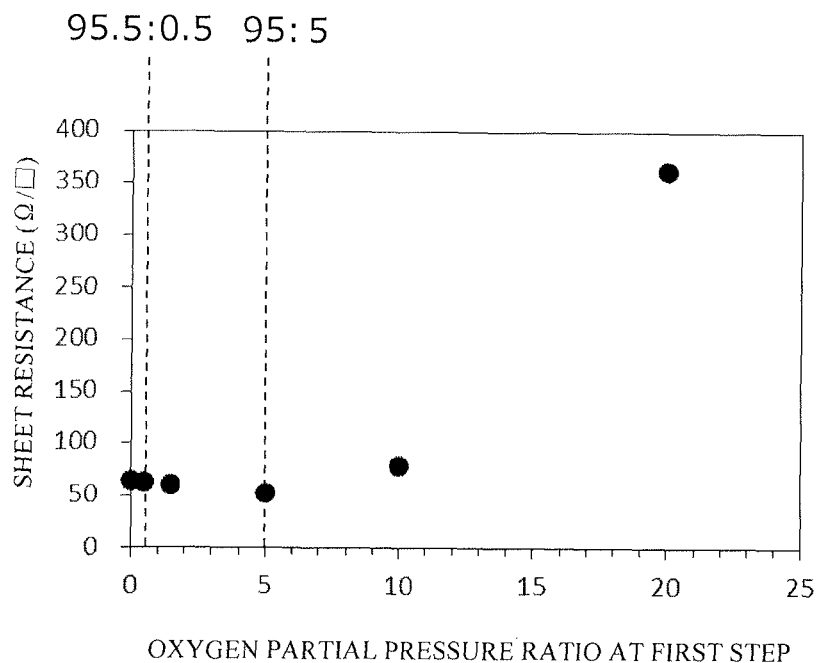
FIG. 14 is a chart illustrating the relationship between the partial pressure ratio between nitrogen and oxygen at the first step and the sheet resistance value of the solar battery cell.

Next, the relationship between the partial pressure ratio (flow rate ratio) between nitrogen and oxygen at the first step and the sheet resistance value of the solar battery cell was examined. Its result is illustrated in FIG. 14. Note that the treatment conditions other than the partial pressure ratio are almost equal conditions. As illustrated in FIG. 14, it is found that when the partial pressure ratio between nitrogen and oxygen at the first step is within a range of 95.5:0.5 to 95:5, the sheet resistance value falls within a preferable range (30 to 150Ω/□) for further improving the conversion efficiency of the solar battery cell.

Figure 15:
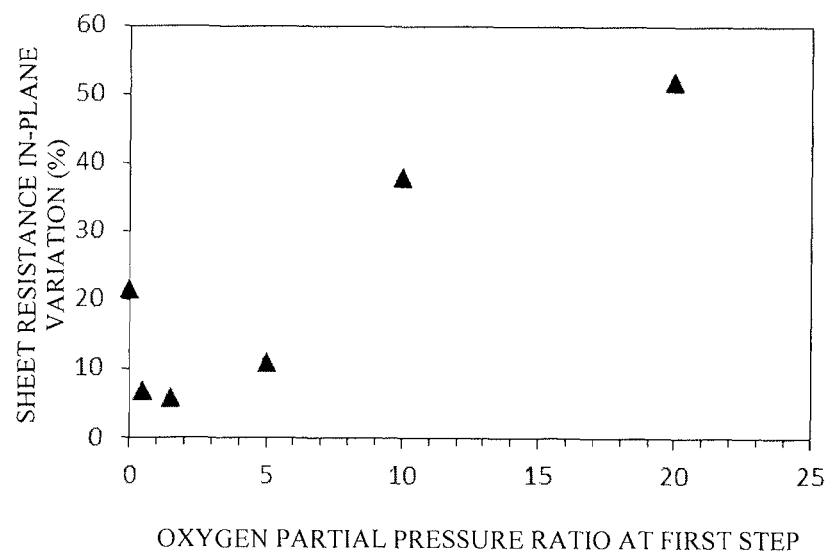
FIG. 15 is a chart illustrating the relationship between the partial pressure ratio between nitrogen and oxygen at the first step and the in-plane variation in sheet resistance value.

Note that even in the case where the partial pressure ratio between nitrogen and oxygen at the first step becomes 90:10, the sheet resistance value falls within the preferable range (30 to 150Ω/□), but the in-plane variation in sheet resistance increases in that case as illustrated in FIG. 15. Accordingly, the partial pressure ratio between nitrogen and oxygen at the first step preferably is within the range of 95.5:0.5 to 95:5.

EXAMPLE 5

Figure 16:
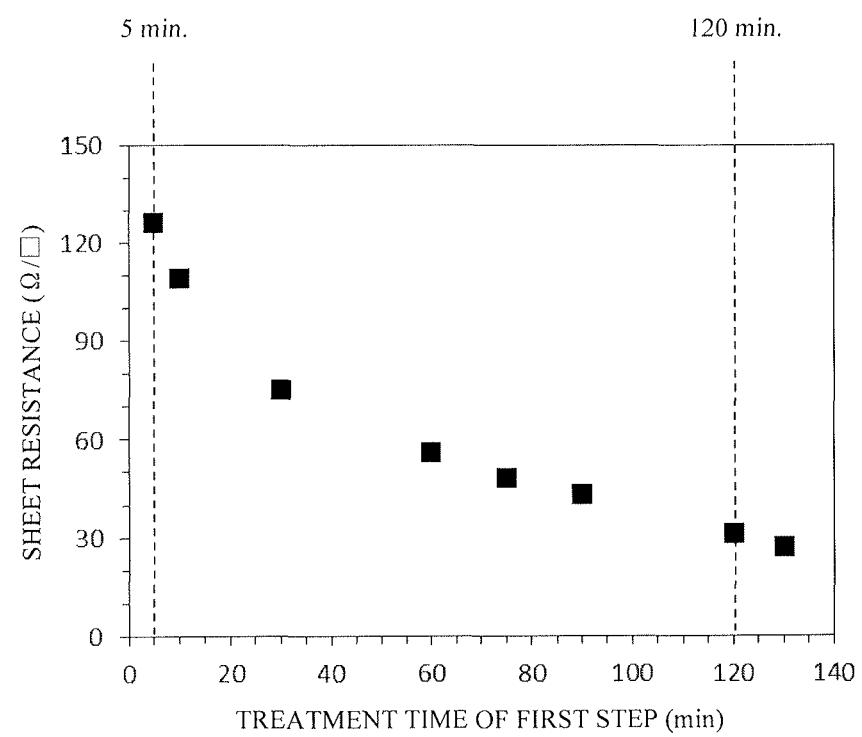
FIG. 16 is a chart illustrating the relationship between the treatment time of the first step and the sheet resistance value of the solar battery cell.

Next, the relationship between the treatment time of the first step and the sheet resistance value of the solar battery cell was examined. Its result is illustrated in FIG. 16. Note that the treatment conditions other than the treatment time of the first step are almost equal conditions. As illustrated in FIG. 16, it is found that when the treatment time of the first step is within a range of 5 to 120 minutes, the sheet resistance value falls within the preferable range (30 to 150Ω/□) for further improving the conversion efficiency of the solar battery cell. Accordingly, the treatment time of the first step preferably is within the range of 5 to 120 minutes.

INDUSTRAIL APPLICABILITY

The present invention is applicable to a boron diffusion layer forming method of forming a boron diffusion layer on a silicon substrate and a method of manufacturing a solar battery cell.

EXPLANATION OF CODES

1 wafer boat
2 boron diffusion layer
3 boron silicide layer
4 boron silicate glass layer
5 resist film
6 phosphorus diffusion layer
7 phosphorus silicate glass layer
8 antireflection film
9 conductive paste
10 Ag grid electrode
11 substrate peripheral edge portion
W substrate
WG substrate group
S front surface
BS back surface

The invention claimed is:

1. A method of manufacturing a solar battery cell with a boron diffusion process, the process comprising a first step of thermally diffusing boron on the silicon substrate and a second step of oxidizing a boron silicide layer formed on the silicon substrate at the first step,
wherein the first step is performed at a first treatment temperature, the second step includes a state at a second treatment temperature that is 900° C. or higher and the first treatment temperature or lower, the state exists for 15 minutes or more, and the second step includes a temperature decrease step of decreasing the second treatment temperature.

2. The method of manufacturing a solar battery cell according to claim 1,
wherein the first treatment temperature is at 920° C. or higher and 1050° C. or lower.

3. The method of manufacturing a solar battery cell according to claim 1,
wherein the first step is performed under an atmosphere in which a flow rate ratio between nitrogen and oxygen is 99.5:0.5 to 95:5.

4. The method of manufacturing a solar battery cell according to claim 1,
wherein the first step is performed for 5 to 120 minutes.

5. The method of manufacturing a solar battery cell according to claim 1,
wherein a film thickness of a boron silicate glass layer formed by the first and second steps is 100 to 200 nm.

6. The method of manufacturing a solar battery cell according to claim 1,
wherein boron tribromide ($BBr_3$) or boron trichloride ($BCl_3$) is used as a diffusion source.

7. The method of manufacturing a solar battery cell according to claim 1,
wherein a boron diffusion source is formed by applying a material containing a boron compound onto the silicon substrate by a spin coating method.

8. The method of manufacturing a solar battery cell according to claim 1,
wherein a boron diffusion source is formed by applying a material containing a boron compound onto the silicon substrate by a screen printing method.

9. The method of manufacturing a solar battery cell according to claim 1,
wherein a boron diffusion source is formed by applying a material containing a boron compound onto the silicon substrate by an inkjet printing method.

10. The method of manufacturing a solar battery cell according to claim 1,
wherein a process of removing a boron diffusion layer and a boron silicate glass layer which are formed on a back surface of the silicon substrate after completion of the boron diffusion process, comprises a process of forming a resist film on a front surface of the silicon substrate, then removing the boron diffusion layer and the boron silicate glass layer which are formed on the back surface of the silicon substrate by a chemical wet treatment, and then removing the resist film on the front surface of the silicon substrate.

11. The method of manufacturing a solar battery cell according to claim 10,
wherein after completion of the process of removing the resist film, a phosphorus diffusion process of diffusing phosphorus on the back surface of the silicon substrate, a process of forming an antireflection film on both surfaces of the silicon substrate, and a process of forming an Ag grid electrode on both the surfaces of the silicon substrate are performed in sequence.

* * * * *